(12) United States Patent
Shin

(10) Patent No.: US 7,622,331 B2
(45) Date of Patent: Nov. 24, 2009

(54) METHOD FOR FORMING CONTACTS OF SEMICONDUCTOR DEVICE

(75) Inventor: Eun-Jong Shin, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 53 days.

(21) Appl. No.: 11/846,967

(22) Filed: Aug. 29, 2007

(65) Prior Publication Data
US 2008/0057707 A1 Mar. 6, 2008

(30) Foreign Application Priority Data
Sep. 6, 2006 (KR) .................. 10-2006-0085482

(51) Int. Cl.
*H01L 23/52* (2006.01)
*H01L 21/4763* (2006.01)

(52) U.S. Cl. ................ 438/110; 257/E21.579

(58) Field of Classification Search .......... 438/622, 438/638, 675, 672, 700, 758, 110, 160, 613; 257/775, E21.46, E21.476, 758, E21.579
See application file for complete search history.

(56) References Cited

U.S. PATENT DOCUMENTS

2005/0287811 A1* 12/2005 Inukai ................. 438/700
2007/0045850 A1*  3/2007 Nogami et al. ............ 257/758

FOREIGN PATENT DOCUMENTS

KR    1020060064289 A    6/2006

OTHER PUBLICATIONS

S. Wolf and R.N. Tauber,"Silicon Processing for the VLSI Era", 2000, Lattice Press, pp. 207-208; 343-347; 667-669; 795-797; 837-838.*
S. A. Campbell, "The Science and Fabrication of Microelectronic Fabrication", 2001, Oxford University Press, pp. 318-319; 343-347.*
M. Naik et al., "Process Integration of Double level Copper- Low k (k=2.8) Interconnect", May 24-26, 1999, Interconnect Technology 1999, International Conference, pp. 181-183.*
C. Hierold, "Intelligent CMOS Sensors", Jan. 23-27, 2000, Micro Electro Mechanical Systems 2000, MEMS 2000, The 13th Annual Conference, pp. 1-6.*

(Continued)

*Primary Examiner*—Thomas L Dickey
*Assistant Examiner*—Nikolay Yushin
(74) *Attorney, Agent, or Firm*—Sherr & Vaughn, PLLC

(57) ABSTRACT

A method for forming contacts of a semiconductor device is provided. A diffusion barrier layer, an interlayer insulating layer, and a capping layer are sequentially formed on a lower metal wiring layer. A hard mask layer is formed on the capping layer. A photoresist layer is formed and patterned to form vias. Vias are formed by sequentially etching the hard mask, capping, and interlayer insulating layers using the patterned photoresist layer as an etch mask until the diffusion barrier layer is exposed. A metal layer is deposited in the vias to form contacts. The metal and hard mask layers are removed until the capping layer is exposed. This prevents tapering at top of the capping layer during plasma treatment, thus preventing tungsten bridges that may occur through margins of vias when a CMOS device with a strict design rule is manufactured and improving electrical characteristics and reliability of semiconductor devices.

19 Claims, 2 Drawing Sheets

OTHER PUBLICATIONS

Wolf, Silicon Processing for VLSI Era, 2000, Lattice Press, pp. 207-208, 343-347; 667-669; 795-797; 837-838.*

Campbell, "The Science and Engineering of Microelectronic Fabrication", 2001, Oxford University Press, pp. 318-319; 343-347.*

Naik, "Process Integration of Doule Level Copper—Low k (k=2.8) Inerconnect", May 24-26, 1999.*

Hierold, "intelligent CMOS Sensors", Jan. 23-27, 2000, MEMS 2000, pp. 1-6.*

* cited by examiner

METHOD FOR FORMING CONTACTS OF SEMICONDUCTOR DEVICE

The present application claims priority under 35 U.S.C. 119 to Korean Patent Application No. 10-2006-0085482 (filed on Sep. 6, 2006) which is hereby incorporated by reference in its entirety.

BACKGROUND

Electronic devices such as computers and televisions incorporate within there operating structure semiconductor devices such as diodes or transistors. Such semiconductor devices may be manufactured through a series of processes of forming a film on a wafer. The semiconductor wafer may be created by growing silicon oxide and implanting impurity ions into required portions of the silicon dioxide film to electrically activate the portions and then connecting wirings between the portions.

As a result of an increase in the integration density of semiconductor devices, it may prove difficult to drive semiconductor devices using one metal wiring layer. Accordingly, the development and use of multilayer semiconductor devices has become prevalent. An interlayer insulating layer is formed between conducting layers of a multilayer semiconductor device in order to provide insulation between the conducting layers. In order to electrically connect the stacked conducting layers, it may be necessary to perform a separate contact process in which contact holes are formed in the interlayer insulating layer and the contact holes subsequently filled with a electrically conducting material. A reduction in size of the semiconductor device and the line width has may become essential in addition to an increase in the integration density of semiconductor devices. Accordingly, technologies for implementing fine line widths have become important in the fabrication of semiconductor devices. There are many limitations and difficulties when patterning narrower lines and smaller contact holes.

Figure 1:
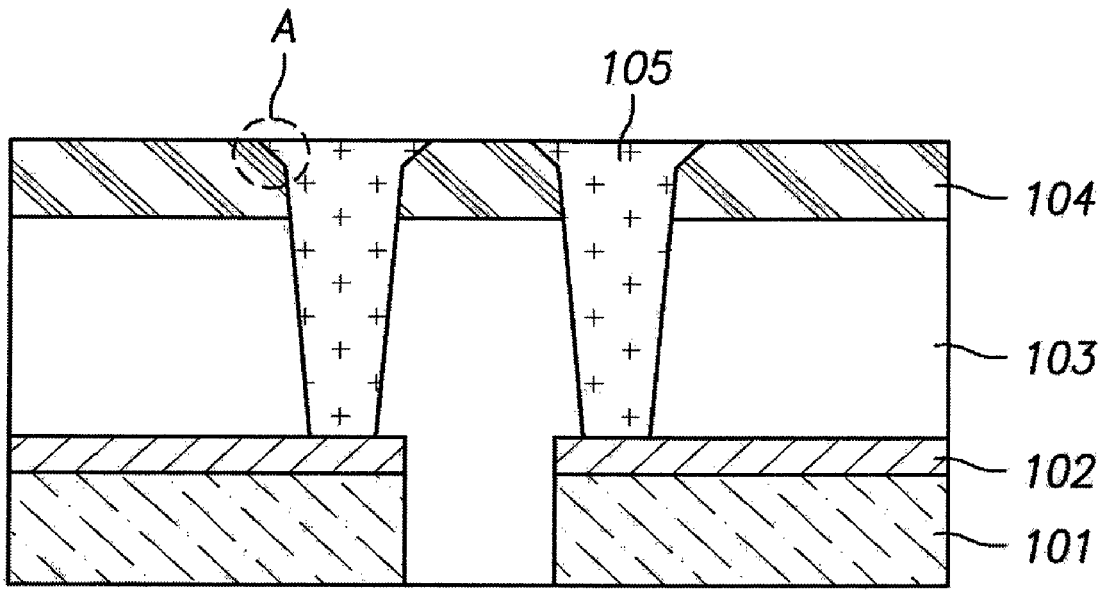

As illustrated in example FIG. 1, interlayer insulating layer 103 is deposited on and/or over lower metal wiring 101. Diffusion barrier layer 102 and capping layer 104 are deposited on and/or over interlayer insulating layer 103 to prevent diffusion of fluorine (F) into interlayer insulating layer 103. To form contact vias, a photoresist material is coated on capping layer 104 and then selectively exposed to light, developed, and patterned. To form contact holes, capping layer 104 and interlayer insulating layer 103 may be etched the patterned photoresist layer as an etch mask. The etching process may utilize a reactive ion etching (RIE) method.

A plasma treatment process is performed to remove a metal organic polymer remaining in the contact vias after RIE. The plasma treatment process may cause tapering at both-side edges of capping layer 104 at upper portions of the contact vias. Chemical mechanical polishing (CMP) may be conducted upon forming contacts 105 by filling tungsten (W) into the gaps of the contact vias with the tapered side edges of capping layer 104. Tungsten bridge "A" may occur depending on the distance between contacts 105. Especially, if the design rule is small such that the contact vias have a small margin between them, a tungsten bridge phenomenon becomes more serious due to tapering of the upper profiles of the contact vias.

SUMMARY

In accordance with embodiments, a method for forming contacts of a semiconductor device is provided that protects a capping layer against damage during polymer removal. This also serves to prevent the occurrence of tapering, and also the occurrence of a tungsten bridge that may take place through the margins of the contact vias when a CMOS device is manufactured, to which a strict design rule is applied.

In accordance with embodiments, a method for forming contacts of a semiconductor device includes forming a metal wiring layer on and/or over a semiconductor substrate; sequentially forming a diffusion barrier layer, an interlayer insulating layer, and a capping layer on and/or over the metal wiring layer; forming a hard mask layer on and/or over the capping layer; forming a photoresist layer on and/or over the hard mask layer and patterning the photoresist layer; forming a plurality of contact vias by sequentially etching the hard mask layer, the capping layer, and the interlayer insulating layer using the patterned photoresist layer as an etch mask until the diffusion barrier layer is exposed; depositing a metal layer in the plurality of vias to form contacts; and removing the metal layer and the hard mask layer until the capping layer is exposed.

DRAWINGS

Example FIG. 1 illustrates a method for forming contacts of a semiconductor device.

Figure 2A:
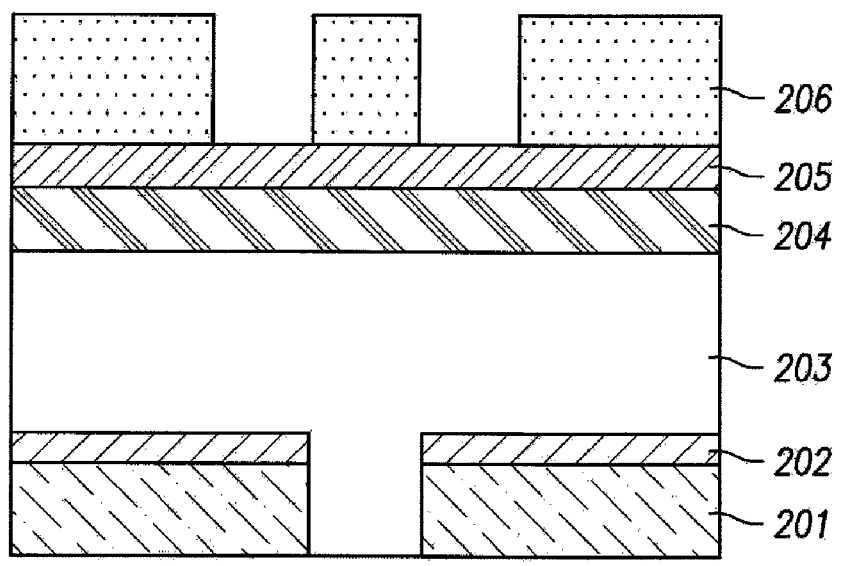
Figure 2B:
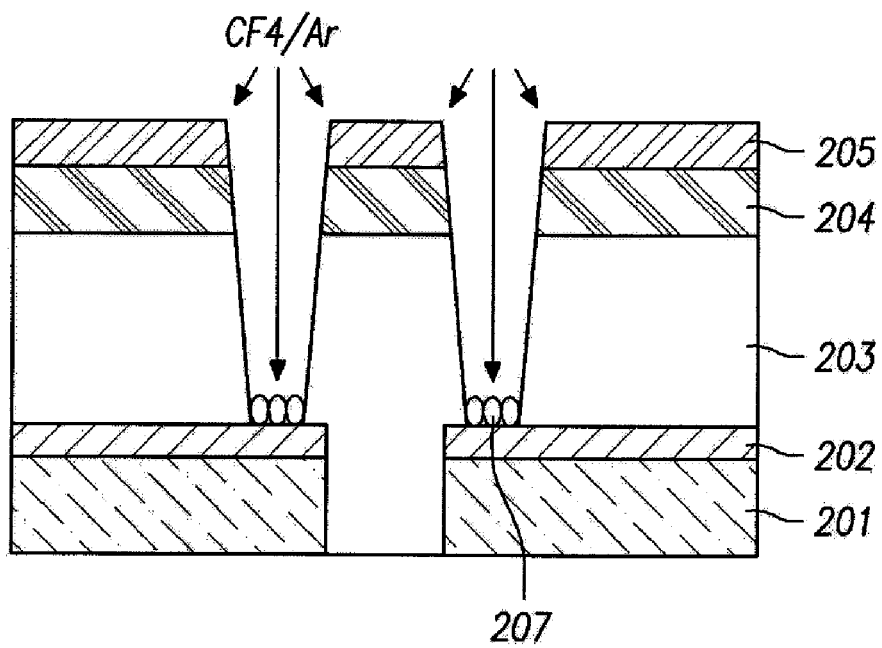
Figure 2C:
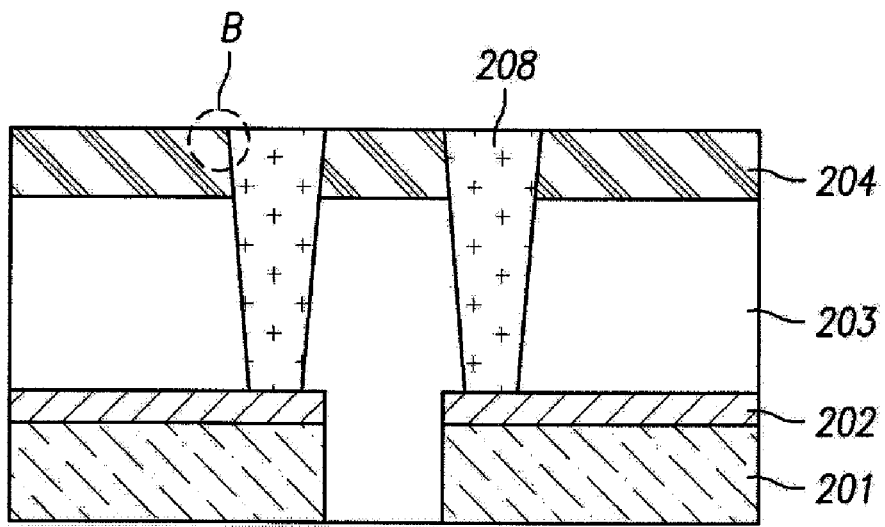

Example FIGS. 2A to 2C illustrate a method for forming contacts of a semiconductor device, in accordance with embodiments.

DESCRIPTION

As illustrated in example FIG. 2A, wiring layer 201 is formed on and/or over a semiconductor substrate. Diffusion barrier layer 202 is formed on metal wiring layer 201. Diffusion barrier layer may be composed of a material such as titanium (Ti) and/or titanium nitride (TiN). Wiring layer 201 may be composed of a metal such as aluminum (Al). Interlayer insulating layer 203 is formed on and/or over metal wiring layer 201 and diffusion barrier layer 202. A low-k material such as un-doped silicate glass (USG) and fluorinated silicate glass (FSG) may be used to form interlayer insulating layer 203 and deposited using a high density plasma chemical vapor deposition (HDP-CVD). Thereafter, capping layer 204 is formed on and/or over interlayer insulating layer 203 to prevent diffusion of fluorine (F) into interlayer insulating layer 203. Capping layer 204 may be composed of $SiH_4$-rich oxide, which contains a large amount of silicon hydride ($SiH_4$).

Hard mask layer 205 is formed on and/or over capping layer 204 to prevent the occurrence of tapering during plasma treatment prior to formation of a photoresist layer on and/or over capping layer 204. Hard mask layer 205 may be formed using a SiN material through a plasma enhanced chemical vapor deposition (PE-CVD). Hard mask layer 205 is preferably formed to a thickness of approximately between 350 Å to 400 Å.

The formation of vias are done by coating a photoresist material on hard mask layer 205 and then selectively exposing the photoresist material to light, developing and then patterning the photoresist material. Accordingly, a plurality of photoresist patterns 206 may be formed at specific intervals on hard mask layer 205. Here, photoresist patterns 206 may be formed to a thickness of between approximately 6000 Å to 8000 Å.

As illustrated in example FIG. 2B, vias may be formed by sequentially etching hard mask layer 205, capping layer 204, and interlayer insulating layer 203 may be sequentially etched until diffusion barrier layer 202 is exposed. The etching process may be done using a dry etching method including RIE.

Once the vias are formed, a plurality of byproducts 207 of the etching process may remain in the vias. Byproducts 207 may be composed of a metal organic polymer material. In order to remove byproducts 207, a subsequent plasma treatment process may be performed using $CF_4$ and Ar gas. This plasma treatment process does not damage capping layer 204 due to silicon nitride material that composes hard mask layer 205, which suppresses the occurrence of tapering. Photoresist patterns 206 may be removed through an ashing process.

As illustrated in example FIG. 2C, a metal layer such as tungsten (W) is deposited in the vias to form contacts 208. Contacts 208 may be formed of a tungsten (W) material using a CVD method. CVD tungsten is a superior material for use a vias fill material and as a multilayer interconnection material by virtue of its good step coverage and its capability to suppress electromigration.

After forming contacts 208 by depositing tungsten in the vias, hard mask layer 205 and a tungsten metal layer deposited to form contacts 208 are removed using a chemical mechanical polishing (CMP) process. The CMP process may be performed simultaneously on the tungsten metal layer and hard mask layer 205 until capping layer 204 is exposed. As illustrated in example FIG. 2C, tapering does not occur at upper portions of the vias, and thus, does not form a tungsten bridge (see "B"). Moreover, hard mask layer 205 may be removed so that it does not remain on interlayer insulating layer 203. In this way, hard mask layer 205 does not exert any influence on permittivity of interlayer insulating layer 203.

In accordance with embodiments, a method for forming contacts of a semiconductor device yields several advantages. In particular, using silicon nitride (SiN) as a hard mask layer interposed between a capping layer and a photoresist layer may suppress occurrences of tapering at an upper region or area of the capping layer caused during by a plasma treatment process. In turn, this may also prevent occurrences of a tungsten bridge that take place through the margins of vias when a CMOS device, to which a strict design rule is applied, is manufactured. Accordingly, the electrical characteristics and reliability of the semiconductor device produced in accordance with embodiments can be enhanced.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a metal wiring layer over a semiconductor substrate;
    sequentially forming a diffusion barrier layer, an interlayer insulating layer, and a capping layer over the metal wiring layer;
    forming a hard mask layer over the capping layer;
    forming a photoresist layer over the hard mask layer;
    patterning the photoresist layer;
    forming a plurality of vias by sequentially etching the hard mask layer, the capping layer, and the interlayer insulating layer using the patterned photoresist layer as an etch mask until the diffusion barrier layer is exposed;
    performing plasma treatment process to remove byproducts which remain in the vias during the etching without damaging the capping layer due to the hard mask layer formed to suppress occurrences of tapering of the capping layer;
    depositing a metal layer in the plurality of vias to form contacts; and
    removing the metal layer and the hard mask layer until the capping layer is exposed.

2. The method of claim 1, wherein the step of forming the plurality of vias includes removing a byproduct material created during etching of the hard mask layer using a plasma treatment process on the byproduct, the capping layer, and the interlayer insulating layer.

3. The method of claim 2, wherein the plasma treatment process uses $CF_4$ and Ar gas.

4. The method of claim 1, further comprising removing the patterned photoresist layer after forming the plurality of vias.

5. The method of claim 1, wherein the step of removing the metal layer and the hard mask layer includes performing a chemical mechanical polishing process simultaneously on the metal layer and the hard mask layer.

6. The method of claim 1, wherein the hard mask layer is formed using SiN having a thickness of between approximately 350 Å to 400 Å.

7. A method comprising:
    forming a wiring layer over a semiconductor substrate;
    forming a diffusion barrier layer over the metal wiring layer;
    forming an interlayer insulating layer over the metal wiring layer and the diffusion barrier layer;
    forming a capping layer over the interlayer insulating layer to prevent diffusion of fluorine into the interlayer insulating layer;
    forming a hard mask layer over capping layer using plasma enhanced chemical vapor deposition;
    forming a photoresist material over the hard mask layer;
    forming a plurality of vias by sequentially etching the hard mask layer, the capping layer, and the interlayer insulating layer until the diffusion barrier layer is exposed;
    performing plasma treatment process to remove byproducts which remain in the vias during the etching without damaging the capping layer due to the hard mask layer formed to suppress occurrences of tapering of the capping layer;
    forming a plurality of contacts by depositing a metal layer in the plurality of vias; and
    removing the hard mask layer and the metal layer using a chemical mechanical polishing process.

8. The method of claim 7, wherein the wiring layer comprises a metallic material.

9. The method of claim 8, wherein the metallic material comprises aluminum.

10. The method of claim 7, wherein the diffusion barrier layer comprises at least one of titanium and titanium nitride.

11. The method of claim 7, wherein the interlayer insulating layer comprises a low-k material.

12. The method of claim 11, wherein the low-k material comprises un-doped silicate glass.

13. The method of claim 11, wherein the low-k material comprises fluorinated silicate glass.

14. The method of claim 7, wherein the interlayer insulating layer is formed using high density plasma chemical vapor deposition.

15. The method of claim 7, wherein the capping layer comprises a SiH4-rich oxide.

16. The method of claim 7, wherein the hard mask layer comprises silicon nitride.

17. The method of claim 16, wherein the hard mask layer is formed to a thickness of between approximately 350 Å to 400 Å.

18. The method of claim 7, wherein the etching step is done using a dry etching method including RIE.

19. The method of claim 7, wherein the metal layer comprises tungsten.

* * * * *